United States Patent
Zhu et al.

(10) Patent No.: US 9,945,050 B2
(45) Date of Patent: *Apr. 17, 2018

(54) SEMICONDUCTOR NANOCRYSTALS AND METHODS OF PREPARATION

(75) Inventors: Zhengguo Zhu, Chelmsford, MA (US); Jonathan S. Steckel, Carlisle, MA (US); Craig Breen, Somerville, MA (US); Justin W. Kamplain, Bartlesville, OK (US); Inia Song, Watertown, MA (US); Chunming Wang, Acton, MA (US)

(73) Assignee: SAMSUNG RESEARCH AMERICA, INC., Mountain View, CA (US)

( * ) Notice: Subject to any disclaimer, the term of this patent is extended or adjusted under 35 U.S.C. 154(b) by 429 days.

This patent is subject to a terminal disclaimer.

(21) Appl. No.: 13/572,012

(22) Filed: Aug. 10, 2012

(65) Prior Publication Data

US 2013/0069018 A1    Mar. 21, 2013

Related U.S. Application Data

(63) Continuation of application No. PCT/US2010/059931, filed on Dec. 10, 2010.

(Continued)

(51) Int. Cl.
*B82Y 40/00* (2011.01)
*B82Y 30/00* (2011.01)
(Continued)

(52) U.S. Cl.
CPC .............. *C30B 29/40* (2013.01); *B01J 13/02* (2013.01); *B82Y 30/00* (2013.01); *B82Y 40/00* (2013.01);
(Continued)

(58) Field of Classification Search
USPC ...... 252/519.3; 423/299; 977/773, 774, 818, 977/896
See application file for complete search history.

(56) References Cited

U.S. PATENT DOCUMENTS 6,106,609 A    8/2000  Yang et al.
6,322,901 B1   11/2001 Bawendi et al.
(Continued)

FOREIGN PATENT DOCUMENTS

JP   WO2012099653 A3   7/2012
WO   WO2005022120 A2   3/2005
(Continued)

OTHER PUBLICATIONS

Aharoni, A., et al , "Synthesis of InAs/CdSe/ZnSe Core/Shell1/Shell2 Structures with Bright and Stable Near-Infared Fluorescence" *J. Am. Chem. Soc.* (2006) vol. 128, pp. 257-264.
(Continued)

*Primary Examiner* — Katie L Hammer
(74) *Attorney, Agent, or Firm* — Cantor Colburn LLP

(57) ABSTRACT

A method for preparing semiconductor nanocrystals comprises reacting cation precursors and anion precursors in a reaction mixture including one or more acids, one or more phenol compounds, and a solvent to produce semiconductor nanocrystals having a predetermined composition. A method for forming a coating on at least a portion of a population of semiconductor nanocrystals is also disclosed. The method comprises forming a first mixture including a population of semiconductor nanocrystals, one or more amine compounds, and a first solvent; adding cation precursors and anion precursors to the first mixture at a temperature sufficient for growing a semiconductor material on at least a portion of an outer surface of at least a portion of the population of semiconductor nanocrystals; and initiating addition of one or more acids to the first mixture after addition of the cation and anion precursors is initiated. Semiconductor nanocrystals and populations thereof are also disclosed.

30 Claims, 3 Drawing Sheets

2,2'-Dihydroxybenzophenone 2,4-Di-tert-butylphenol

2-Phenylphenol 2,6-Diphenylphenol

Related U.S. Application Data

(60) Provisional application No. 61/303,286, filed on Feb. 10, 2010.

(51) Int. Cl.

| | | |
|---|---|---|
| *H01B 1/12* | (2006.01) | |
| *C30B 29/40* | (2006.01) | |
| *C30B 28/04* | (2006.01) | |
| *B01J 13/02* | (2006.01) | |
| *C30B 7/14* | (2006.01) | |
| *C30B 29/48* | (2006.01) | |
| *C30B 29/60* | (2006.01) | |
| *H01L 21/02* | (2006.01) | |
| *H01L 33/30* | (2010.01) | |

(52) U.S. Cl.
CPC ............. *C30B 7/14* (2013.01); *C30B 28/04* (2013.01); *C30B 29/48* (2013.01); *C30B 29/60* (2013.01); *C01P 2004/64* (2013.01); *H01L 21/02601* (2013.01); *H01L 33/30* (2013.01); *H01L 33/305* (2013.01)

(56) References Cited

U.S. PATENT DOCUMENTS

| | | | |
|---|---|---|---|
| 6,576,291 | B2 | 6/2003 | Bawendi et al. |
| 7,147,712 | B2 | 12/2006 | Zehnder et al. |
| 7,172,791 | B2 | 2/2007 | Treadway et al. |
| 7,250,082 | B2 | 7/2007 | Jang et al. |
| 7,288,468 | B2 | 10/2007 | Jang et al. |
| 7,465,352 | B2 | 12/2008 | Cao |
| 7,557,028 | B1 | 7/2009 | Scher et al. |
| 7,621,997 | B2 | 11/2009 | Jun et al. |
| 8,354,785 | B2 | 1/2013 | Clough et al. |
| 9,136,428 | B2 | 9/2015 | Clough et al. |
| 9,534,173 | B2 | 1/2017 | Clough et al. |
| 2002/0066401 | A1 | 6/2002 | Peng et al. |
| 2003/0010987 | A1 | 1/2003 | Banin et al. |
| 2003/0173541 | A1* | 9/2003 | Peng et al. ............ 252/301.4 R |
| 2003/0209105 | A1 | 11/2003 | Bawendi et al. |
| 2004/0022937 | A1 | 2/2004 | Bonitatebus et al. |
| 2005/0129947 | A1 | 6/2005 | Peng et al. |
| 2006/0110313 | A1 | 5/2006 | Cho et al. |
| 2006/0130741 | A1 | 6/2006 | Peng et al. |
| 2006/0157720 | A1 | 7/2006 | Bawendi et al. |
| 2006/0202167 | A1* | 9/2006 | Landry et al. ......... 252/301.4 R |
| 2007/0049765 | A1 | 3/2007 | Lucey et al. |
| 2007/0221121 | A1* | 9/2007 | Zehnder et al. ............... 117/88 |
| 2007/0289491 | A1* | 12/2007 | Peng et al. ................. 106/286.6 |
| 2008/0099728 | A1 | 5/2008 | Jin et al. |
| 2008/0160306 | A1* | 7/2008 | Mushtaq ............... C01B 25/082 428/402 |
| 2008/0202383 | A1 | 8/2008 | Shi |
| 2008/0220593 | A1* | 9/2008 | Pickett ................... B82Y 30/00 438/478 |
| 2008/0247932 | A1 | 10/2008 | Li et al. |
| 2008/0258159 | A1 | 10/2008 | Jun et al. |
| 2009/0073349 | A1 | 3/2009 | Park et al. |
| 2009/0162011 | A1 | 6/2009 | Coe-Sullivan et al. |
| 2009/0230382 | A1 | 9/2009 | Banin et al. |
| 2009/0278141 | A1 | 11/2009 | Coe-Sullivan et al. |
| 2010/0052512 | A1* | 3/2010 | Clough .................. B82Y 30/00 313/498 |
| 2010/0068468 | A1 | 3/2010 | Coe-Sullivan et al. |
| 2010/0090164 | A1 | 4/2010 | Peng et al. |
| 2010/0159248 | A1 | 6/2010 | Jang et al. |
| 2010/0265307 | A1 | 10/2010 | Linton et al. |
| 2010/0283014 | A1 | 11/2010 | Breen et al. |
| 2011/0140075 | A1 | 6/2011 | Zhou et al. |
| 2011/0155969 | A1* | 6/2011 | Bartel ....................... B22F 1/00 252/519.4 |
| 2011/0223110 | A1 | 9/2011 | Bartel et al. |
| 2011/0245533 | A1 | 10/2011 | Breen et al. |
| 2012/0256134 | A1 | 10/2012 | Nick |
| 2012/0256141 | A1 | 10/2012 | Nick et al. |
| 2013/0009131 | A1 | 1/2013 | Kazlas et al. |
| 2013/0037778 | A1 | 2/2013 | Kazlas et al. |
| 2013/0092886 | A1 | 4/2013 | Kahen et al. |
| 2013/0273247 | A1 | 10/2013 | Kamplain et al. |
| 2014/0227862 | A1 | 8/2014 | Song et al. |
| 2014/0312286 | A1 | 10/2014 | Kamplain et al. |
| 2014/0322901 | A1 | 10/2014 | Huang et al. |
| 2015/0166341 | A1 | 6/2015 | Hamilton et al. |

FOREIGN PATENT DOCUMENTS

| | | | |
|---|---|---|---|
| WO | WO 2008133660 A2 * | 11/2008 | ............ B82Y 30/00 |
| WO | WO2009097319 A2 | 8/2009 | |
| WO | WO2011100023 A1 | 8/2011 | |
| WO | WO2012099653 A2 | 7/2012 | |
| WO | WO2013173409 A1 | 11/2013 | |

OTHER PUBLICATIONS

Allen, P.M. et al., "InAs(ZnCdS) Quantum Dots Optimized for Biological Imaging in the Near-Infrared" J. Am. Chem. Soc. (2010), vol. 132, No. 2, pp. 470-471.

Allen, P.M., et al., Supporting Information, pp. S1-S8, for: "InAs(ZnCdS) Quantum Dots Optimized for Biological Imaging in the Near-Infrared" J. Am. Chem. Soc. (2010), vol. 132, No. 2, pp. 470-471.

Battaglia, D., et al., "Formation of High Quality InP and InAs Nanocrystals in a Noncoordinating Solvent", *Nano Letters* (2002) vol. 2, No. 9, pp. 1027-1030.

Cao, Y.-W., et al., "Synthesis and Characterization of InAs/InP and InAs/CdSe Core/Shell Nanocrystals", *Communication—Angew. Chem. Int. Ed.* (1999), vol. 38, No. 24, pp. 3692-3694.

Guzelian, A. et al., "Colloidal chemical synthesis and characterization of InAs nanocrystal quantum dots", *Appl. Phys. Lett.*, 69 (10), 1432-1434, Sep. 2, 1996.

Haubold, S., "Strongly Luminescent InP/ZnS Core-Shell Nanoparticles", *Chem Phys Chem* (2001), vol. 2, Issue 5, pp. 331-334.

Hollingsworth, J.A., et al., "Low-Temperature, Solution-Based Routes to Nanocrystalline InS Powders and Thin Films", *MRS Proceedings*, (1998) 495, pp. 197-202.

Hollingsworth, J.A., et al., "Soft Chemical Synthesis and Manipulation of Semiconductor Nanocrystals", *Semiconductor and Metal Nanocrystals: Synthesis and Electronic and Optical Properties*, Klimov, ed. 2004, Marcel Dekker, pp. 1-64.

Kim, S-W., et al. "Engineering $InAs_xP1-xInP/ZnSe$ III-V Alloyed Core/Shell Quantum Dots for the Near-Infrared" *J.Am. Chem. Soc.* (2005), vol. 127, pp. 10526-10532.

Kortan, A.R., et al., "Nucleation and Growth of CdSe on ZnS Quantum Crystallite Seeds, and Vice Versa, in Inverse Micelle Media", *J. Amer. Chem. Soc.*, 1990, vol. 112, No. 4, 1327-1332.

Kumar, S. et al., "Synthesis and electrochemical properties of InP nanocrystals", *J. Mater. Res.*, (2006), vol. 21, No. 3, pp. 543-546.

Mićić, O.I.,et al., "Synthesis and Characterization of InP Quantum Dots", *J. Phys. Chem.* (1994), vol. 98, pp. 4966-4969.

Mićić, O.I.,et al., "Size-Dependent Spectroscopy of InP Quantum Dots", J. Phys. Chem. (1997) vol. 101, pp. 4904-4912.

Murray, C.B., et al., Synthesis and characterization of nearly monodisperse CdE (E = S, Se, Te) semiconductor nanocrystallites, *J. Am. Chem. Soc.*, (1993) vol. 115, pp. 8706-8715.

Murray, C.B., "Synthesis and Characterization of II-VI Quantum Dots and Their Assembly into 3-D Quantum Dot Superlattices", Thesis, Massachusetts Institute of Technology, Sep. 1995.

PCT/US2010/059931 Search Report and Written Opinion dated Apr. 12, 2011. PCT/US2010/059931 is the parent of this case.

Ryu, E., et al., "Step-Wise Synthesis of InP/ZnS Core/Shell Quantum Dots and the Role of Zinc Acetate", *Chem. Mater.*, 2009, 21 (4), pp. 573-575.

Trikalitis, P.N., et al., "Mesostructured cobalt and nickel molybdenum sulfides", *Microporous and Mesoporous Materials* (online), vol. 88, Iss. 1-3, pp. 187-190.

(56) References Cited

OTHER PUBLICATIONS

Wells, R. et al., "Pathways to Nanocrystalline III-V (13-15) Compound Semiconductors" *Journal of Cluster Science* (1997) vol. 8, No. 2, pp. 217-238.

Xie, R., et al., "Synthetic Scheme for High-Quality InAs Nanocrystals Based on Self-Focusing and One-Pot Synthesis of InAs-Based Core Shell Nanocrystals" *Angew. Chem. Int. Ed.* (2008), vol. 47, pp. 7677-7680.

Xie, R., et al., Supporting Information, 6 pgs., for: "Synthetic Scheme for High-Quality InAs Nanocrystals Based on Self-Focusing and One-Pot Synthesis of InAs-Based Core-Shell Nanocrystals" *Angew. Chem. Int. Ed.* (2008), vol. 47, pp. 7677-7680.

Xie, R., et al., "Colloidal InP Nanocrystals as Efficient Emitters Covering Blue to Near-Infrared", *J. Am. Chem. Soc.*, 2007, 129, pp. 15432-15433.

Xie, R., et al., "InAs/InP/ZnSe Core/Shell/Shell Quantum Dots as Near-Infrared Emitters: Bright, Narrow-Band, Non-Cadmium Containing, and Biocompatible" *Nano Res* (2008), vol. 1, pp. 457-464.

Xu, S., et al., "Rapid Synthesis of High-Quality InP Nanocrystals", *J. Am. Chem. Soc.*, 2006, 128, No. 4, pp. 1054-1055.

Xu, S., et al., "Rapid synthesis of highly luminescent InP and InP/ZnS nanocrystals", *J. Mater. Chem.*, 2008, 18, pp. 2653-2656.

Zimmer, J.P., et al., "Size series of small indium arsenide-zinc selenide core-shell nanocrystals and their application to in vivo imaging", *J. Am. Chem. Soc.* (2006), vol. 128, pp. 2526-2527.

Zimmer, J.P., et al., Supporting Information for (above) : "Size series of small indium arsenide-zinc selenide core-shell nanocrystals and their application to in vivo imaging", *J. Am. Chem. Soc.* (2006), vol. 128, pp. 2526-2527.

Cizeron, et al., "Solid Solution of $CdyZn_{1-y}S$ Nanosized Particles: Photophysical Properties", J. Phys. Chem. B (1997), vol. 101, pp. 8887-8891.

Lee, et al., "Brightening, Blinking, Bluing and Bleaching in the Life of a Quantum Dot: Friend or Foe?", ChemPhysChem, (2009), vol. 10, pp. 2174-2191.

Li, et al., "One-Pot Synthesis of Highly Luminescent InP/ZnS Nanocrystals without Precursor Injection", J. Am. Chem. Soc. (2008), vol. 130 (35), pp. 11588-11589.

PCT Search Report and Written Opinion dated Aug. 31, 2012 for International Application No. PCT/US2011/063919, which claims priority to U.S. Appl. No. 13/913,108, 13 pages.

\* cited by examiner 2,2'-Dihydroxybenzophenone 2,4-Di-tert-butylphenol

2-Phenylphenol 2,6-Diphenylphenol

SEMICONDUCTOR NANOCRYSTALS AND METHODS OF PREPARATION

This application is a continuation of commonly owned International Application No. PCT/US2010/059931 filed 10 Dec. 2010, which was published in the English language as PCT Publication No. WO 2011/100023 on 18 Aug. 2011, which International Application claims priority to U.S. Application No. 61/303,286, filed 10 Feb. 2010. Each of the foregoing is hereby incorporated herein by reference in its entirety.

FEDERALLY SPONSORED RESEARCH OR DEVELOPMENT

This invention was made with Government support under Advance Technology Program Award No. 70NANB7H7056 awarded by NIST. The United States has certain rights in the invention.

TECHNICAL FIELD OF THE INVENTION

The present invention relates to the technical field of nanotechnology, and more particularly to semiconductor nanocrystals and methods for preparing same.

SUMMARY OF THE INVENTION

In accordance with one aspect of the present invention, there is provided a method for preparing semiconductor nanocrystals, the method comprising: adding one or more cation precursors and one or more anion precursors to a mixture including one or more acids, one or more phenol compounds, and a solvent to form a reaction mixture, and reacting at least a portion of the one or more cation and anion precursors at a temperature and for a period of time sufficient to produce semiconductor nanocrystals having a predetermined composition.

In certain embodiments, the mixture including one or more acids, one or more phenol compounds, and a solvent is preheated prior to addition of the precursors. In certain of such embodiments, the preheat temperature is sufficient for initiating reaction between cation and anion precursors. In certain of such embodiments, the reaction mixture may further optionally be heated or maintained at a temperature or range of temperatures sufficient to produce semiconductor nanocrystals having the predetermined composition. In certain embodiments, such temperature or range of temperature can be the same as or include the preheat temperature.

In certain embodiments, the method can comprise adding one or more cation precursors and one or more anion precursors to a mixture including one or more acids, one or more phenol compounds, and a solvent to form a reaction mixture, and heating the reaction mixture at a temperature and for a period of time sufficient to produce semiconductor nanocrystals having a predetermined composition.

In certain embodiments, at least one cation precursor comprises a Group III cation precursor and at least one anion precursor comprises a Group V anion precursor.

In certain embodiments, one or more phenol compounds comprise a monocyclic phenol or a polycyclic phenol.

In certain embodiments, at least one or the one or more phenol compounds comprises a mixture of two or more different phenol compounds.

In certain embodiments, one or more of the acids included in the mixture comprise a carboxylic acid compound.

In certain embodiments, each of the one or more acids comprises a carboxylic acid compound.

In certain embodiments including one or more carboxylic acid compounds in the mixture, at least one of the one or more carboxylic acid compounds further comprises one or more alkyl groups.

In certain embodiments including a carboxylic acid compound in the mixture, at least one of the one or more carboxylic acid compounds comprises $CH_3(CH_2)_nC(O)OH$ wherein n=1-18.

In certain embodiments including one or more carboxylic acid compounds in the mixture, at least one of the one or more carboxylic acid compounds further comprises one or more aromatic groups.

In certain embodiments, the one or more cation precursors and the one or more anion precursors are added to the reaction mixture as a single precursor mixture. In certain of such embodiments, the precursor mixture further includes a solvent. In certain of such embodiments, a solvent can comprise a mixture of solvents. In certain of such embodiments, a solvent comprises a weakly coordinating solvent. In certain of such embodiments, a solvent comprises a non-coordinating solvent.

In certain embodiments, the precursor mixture further comprises one or more amine compounds.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is greater than about 4.5.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is in a range from about 4.5 to about 5.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is in a range from about 4.5 to about 6.

In certain embodiments, the reaction is carried out in the presence of one or more different ligands.

In certain embodiments, the reaction is initiated at a temperature in the range from about 180° C. to about 270° C.

In certain embodiments, the reaction is initiated at a temperature of approximately 200° C.

In certain embodiments, the reaction mixture is at a temperature in the range from about 180° C. to about 270° C.

In certain embodiments, the reaction mixture is at a temperature of approximately 200° C.

In certain embodiments, the method further comprises adjusting the temperature after reaction of precursors is initiated to a second temperature sufficient to grow nanocrystals.

In certain embodiments, the method further comprises isolating the nanocrystals from the reaction mixture.

In certain embodiments, the method comprises a method for preparing semiconductor nanocrystals comprising a Group III element and a Group V element. In certain of such embodiments, the method comprises combining one or more Group III cation precursors, one or more Group V anion precursors, one or more ligands, one or more amine compounds, and a first solvent to form a first mixture; adding the first mixture to a second mixture, the second mixture comprising one or more carboxylic acid compounds, one or more phenol compounds, and a second solvent, wherein at the time of addition, the second mixture is at a temperature sufficient to initiate reaction of one or more Group III cation precursors with one or more of the Group V anion precursors. In certain of such embodiments, the method can further include adjusting the temperature after reaction of precursors is initiated to a second temperature sufficient to grow nanocrystals.

In certain of such embodiments, the method can further include isolating the nanocrystals from the reaction mixture.

In accordance with another aspect of the present invention, there is provided a method for forming a coating on at least a portion of a population of semiconductor nanocrystals, the method comprising: forming a first mixture including a population of semiconductor nanocrystals, one or more amine compounds, and a first solvent; adding one or more cation precursors and one or more anion precursors to the first mixture, wherein the temperature of the first mixture during addition of the precursors is sufficient for growing a semiconductor material comprising one or more of the cations and one or more of the anions on at least a portion of an outer surface of at least a portion of the population of semiconductor nanocrystals; and initiating addition of one or more acids to the first mixture after addition of the cation and anion precursors is initiated.

In certain embodiments, the one or more acids are added at a predetermined rate.

In certain embodiments, one or more acids are added to the first mixture as a solution further comprising a solvent.

In certain embodiments, at least one of the one or more acids comprises a phosphonic acid compound.

In certain embodiments, each of the one or more acids comprises a phosphonic acid compound.

In certain embodiments, one or more one of the acids comprises a phosphonic acid compound that further comprises one or more aromatic groups. In certain of such embodiments, the phosphonic acid compound further comprising one or more aromatic groups is added to the first mixture as a solution further comprising an aromatic solvent. In certain of such embodiments, for example, an aromatic solvent comprises diphenylbenzene or 1-dodecyl-2-pyrrolidinone.

In certain embodiments, one or more one of the acids comprises a phosphonic acid compound that further comprises one or more aromatic groups and one or more of the amine compounds further comprises one or more aromatic groups.

In certain embodiments, one or more of the acids comprise a phosphonic acid compound that further comprises one or more alkyl groups. In certain of such embodiments, the phosphonic acid compound further comprising one or more alkyl groups is added to the first mixture as a solution further comprising a non-aromatic non-coordinating or weakly coordinating solvent.

In certain embodiments, one or more one of the acids comprises a phosphonic acid compound that further comprises one or more alkyl groups and one or more of the amine compounds further comprises one or more alkyl groups.

In certain embodiments, at least one of the one or more acids comprises a carboxylic acid compound.

In certain embodiments, each of the one or more acids comprises a carboxylic acid compound.

In certain embodiments, mixtures of different acids can be included.

In certain embodiments, the addition of the one or more cation precursors and the one or more anion precursors is a stepwise addition.

In certain embodiments, the addition of the one or more acids is a stepwise addition.

In certain embodiments, the temperature is in a range from about 150° C. to about 350° C.

In certain embodiments, the temperature is in a range from about 150° C. to about 300° C.

In certain embodiments, the temperature is in a range from about 200° C. to about 250° C.

In certain embodiments, the temperature is about 250° C.

In certain embodiments, at least one of the one or more amine compounds comprises a primary amine.

In certain embodiments, each of the one or more amine compounds comprises a primary amine.

In certain embodiments, at least one of the one or more amine compounds comprises a secondary amine.

In certain embodiments, each of the one or more amine compounds comprises a secondary amine.

In certain embodiments including one or more amine compounds, a mixture of primary amines and secondary amines can be included.

In certain embodiments, the one or more cation precursors and one or more anion precursors are added separately.

In certain embodiments, the one or more cation precursors are added separately from the one or more anion precursors.

In certain embodiments, the one or more cation precursors and one or more anion precursors are added concurrently.

In certain embodiments, the one or more cation precursors and one or more anion precursors are added at a predetermined rate.

In certain embodiments, the one or more cation precursors are included in a solution further including a solvent.

In certain embodiments, the one or more anion precursors are included in a solution further comprising a solvent.

In certain embodiments, the population of semiconductor nanocrystals included in the first mixture comprise semiconductor nanocrystals prepared in accordance with a method taught herein comprising: adding one or more cation precursors and one or more anion precursors to a mixture including one or more acids, one or more phenol compounds, and a solvent to form a reaction mixture, and heating the reaction mixture at a temperature and for a period of time sufficient to produce semiconductor nanocrystals having a predetermined composition.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more acids to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more phosphonic acid compounds to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more carboxylic acid compounds to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

In accordance with another aspect of the present invention, there is provided a semiconductor nanocrystal prepared in accordance with any of the methods taught herein.

In accordance with another aspect of the present invention, there is provided semiconductor nanocrystal comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further including one or more aromatics group and an amine compound further including one or more aromatic groups.

In certain preferred embodiments, the ligands comprise phenylbutyl amine and benzylphosphonic acid.

In accordance with another aspect of the present invention, there is provided population of semiconductor nanocrystals including semiconductor nanocrystal comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further including one or more aromatics group and an amine compound further including one or more aromatic groups, wherein the solution quantum yield of the population is at least 70%.

In accordance with another aspect of the present invention, there is provided a population of semiconductor nanocrystals comprising a semiconductor nanocrystal comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further and an amine compound, wherein the solution quantum yield of the population is at least 70%.

In certain preferred embodiments, the ligands comprise decyl amine and octadecyl phosphonic acid.

As used herein, "phenol compound" refers to any compound that includes at least one six-membered aromatic ring that is bonded directly to a hydroxyl group (—OH).

As used herein, an "amine compound" refers to any organic compounds that contains at least one basic nitrogen atom with a lone electron pair or compound that includes an organic functional group that contains at least one basic nitrogen atom with a lone electron pair.

As used herein, a "phosphonic acid compound" refers to a compound including at least one phosphonic acid group.

As used herein, a "carboxylic acid compound" refers to a compound including at least one carboxylic acid group.

The foregoing, and other aspects described herein, all constitute embodiments of the present invention.

It should be appreciated by those persons having ordinary skill in the art(s) to which the present invention relates that any of the features described herein in respect of any particular aspect and/or embodiment of the present invention can be combined with one or more of any of the other features of any other aspects and/or embodiments of the present invention described herein, with modifications as appropriate to ensure compatibility of the combinations. Such combinations are considered to be part of the present invention contemplated by this disclosure.

Additional information concerning the foregoing, and other information useful with the present inventions is provided below.

It is to be understood that both the foregoing general description and the following detailed description are exemplary and explanatory only and are not restrictive of the invention as claimed. Other embodiments will be apparent to those skilled in the art from consideration of the description and drawings, from the claims, and from practice of the invention disclosed herein.

Figure 1:
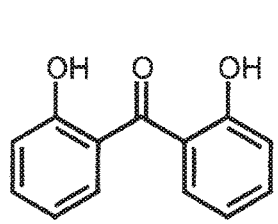
FIG. 1 illustrates chemical structures of examples of various phenol compounds useful with the present invention.
Figure 1:
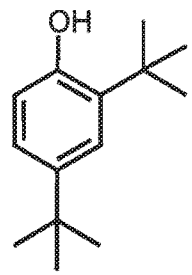
Figure 1:
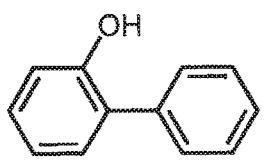
Figure 1:
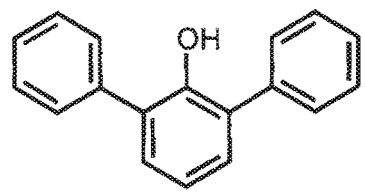

For a better understanding to the present invention, together with other advantages and capabilities thereof, reference is made to the following disclosure and appended claims in connection with the above-described drawings.

DETAILED DESCRIPTION OF THE INVENTION

Various aspects and embodiments of the present inventions will be further described in the following detailed description.

The present invention relates to methods for preparing semiconductor nanocrystals. The present invention further relates to semiconductor nanocrystals. The present invention further also relates to populations of semiconductor nanocrystals.

In accordance with one aspect of the present invention, there is provided a method for preparing semiconductor nanocrystals, the method comprising adding one or more cation precursors and one or more anion precursors to a mixture including one or more acids, one or more phenol compounds, and a solvent to form a reaction mixture, and reacting at least a portion of the one or more cation precursors and one or more anion precursors in the reaction mixture at a temperature and for a period of time sufficient to produce semiconductor nanocrystals having a predetermined composition.

Examples of phenol compounds includes, for example, but are not limited to, resorcinol or hydroquinone, bisphenol F, bisphenol A, 2,2'-dihydroxybenzophenone, 2,4-di-tert-butylphenol, 2-phenylphenol, 2,6-diphenylphenol. Other phenols for use in the method can be identified by the skilled artisan.

In certain embodiments, one or more phenol compounds comprise a monocyclic phenol or a polycyclic phenol.

In certain embodiments, at least one or the one or more phenol compounds comprises a mixture of two or more different phenol compounds.

In certain embodiments, one or more of the acids included in the mixture comprise a carboxylic acid compound.

In certain embodiments, each of the one or more acids comprises a carboxylic acid compound.

In certain embodiments including one or more carboxylic acid compounds in the mixture, at least one of the one or more carboxylic acid compounds further comprises one or more alkyl groups.

In certain embodiments including a carboxylic acid compound in the mixture, at least one of the one or more carboxylic acid compounds comprises $CH_3(CH_2)_nC(O)OH$ wherein n=1-18.

In certain embodiments including one or more carboxylic acid compounds in the mixture, at least one of the one or more carboxylic acid compounds further comprises one or more aromatic groups.

Examples of carboxylic acid compounds for use in the method include, but are not limited to, $CH_3(CH_2)_nC(O)OH$ wherein n=6-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid). In certain embodiments, a carboxylic acid compound comprises oleic acid. Other carboxylic acid compounds for use in the method can be identified by one of ordinary skill in the art.

In certain embodiments, the one or more cation precursors and the one or more anion precursors are added to the reaction mixture as a single precursor mixture. In certain of such embodiments, the precursor mixture further includes a solvent. In certain of such embodiments, a solvent can comprise a mixture of solvents. In certain of such embodiments, a solvent comprises a weakly coordinating solvent. In certain of such embodiments, a solvent comprises a non-coordinating solvent.

Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range form 0 to about 0.2 μ/D. In certain embodiments, weakly coordinating solvents can be used. In certain embodiments, weakly coordinating solvents comprise liquids having a dipole moment in the range from 0.2 to 0.7 μ/D. Other non-coordinating solvents and weakly coordinating solvents that are compatible with the reaction conditions and that will not react with the semiconductor nanocrystals or ligands can be identified by one of ordinary skill in the art. In certain of such embodiments a solvent with a boiling point greater than 250° C. may be useful or desirable.

In certain embodiments, the precursor mixture further comprises one or more amine compounds.

In certain embodiments of methods taught herein, the methods include an amine compound. Examples of amine compounds include, but are not limited to, primary amines, e.g., $CH_3(CH_2)_nNH_2$ wherein n=5-19 (e.g., hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine), and secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, didundecylamine, didodecylamine), etc. In certain embodiments, an amine comprises decylamine, octadecylamine, and/or oleylamine.). In certain embodiments, an amine compound has a boiling point greater than 200° C. In certain embodiments, an amine can comprise a tertiary amine. Other amines can be readily ascertained by one of ordinary skill in the art.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is greater than about 4.5.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is in a range from about 4.5 to about 5.

In certain embodiments including one or more phenol compounds, one or more acids, and one or more amine compounds in the reaction mixture, the molar ratio of [the one or more phenol compounds plus the one or more acids plus the one or more amine compounds] to the one or more cations included in the reaction mixture is in a range from about 4.5 to about 6.

In certain embodiments any of the one or more of the phenol compounds may include more than one —OH group, any of one or more of the acids may include more than one H+ or acid group, and any one or more of the amine compounds may include more than one amine group. In such embodiments, the molar ratio may be adjusted accordingly.

In certain embodiments, the reaction is carried out in the presence of one or more different ligands. Ligands are discussed elsewhere herein.

In certain embodiments, the reaction is initiated at a temperature is in a range from about 180° C. to about 270° C.

In certain embodiments, the reaction is initiated at a temperature of about approximately 200° C.

In certain embodiments, the method further comprises adjusting the temperature after reaction of precursors is initiated to a second temperature sufficient to grow nanocrystals. In certain embodiments, the temperature is adjusted downward for growth.

In certain embodiments, the mixture including one or more acids, one or more phenol compounds, and a solvent is preheated prior to addition of the precursors. In certain embodiments, the preheat temperature is a temperature sufficient to initiate reaction of precursors when added thereto. In certain embodiments, the preheat temperature can be in a range from about 180° C. to about 270° C. In certain embodiments, the preheat temperature can be about 200° C. In certain of such embodiments, the reaction mixture is optionally heated or maintained at a temperature or range of temperatures sufficient to produce semiconductor nanocrystals having the predetermined composition. In certain embodiments, such temperature or range of temperatures can be in a range from about 180° C. to about 270° C. In certain embodiments, such temperature can be about 200° C.

In certain embodiments, the method comprises adding one or more cation precursors and one or more anion precursors to a mixture including one or more acids, one or more phenol compounds, and a solvent to form a reaction mixture, and heating the reaction mixture at a temperature and for a period of time sufficient to produce semiconductor nanocrystals having a predetermined composition. In certain of such embodiments, the reaction mixture is heated at a temperature in the range from about 180° C. to about 270° C. In certain embodiments, the reaction mixture is heated at a temperature of approximately 200° C.

In certain embodiments, the method further comprises isolating the nanocrystals from the reaction mixture.

In certain embodiments, the reaction is carried out in an inert atmosphere, where exposure to air is substantially, and preferably completely, precluded.

In certain embodiments, the method comprises a method for preparing semiconductor nanocrystals comprising a Group III element and a Group V element. In certain of such embodiments, the method comprises combining one or more Group III cation precursors, one or more Group V anion precursors, one or more ligands, one or more amine compounds, and a first solvent to form a first mixture; adding the first mixture to a second mixture, the second mixture comprising one or more carboxylic acid compounds, one or more phenol compounds, and a second solvent, wherein at the time of addition, the second mixture is at a temperature sufficient to initiate reaction of one or more Group III cation precursors with one or more of the Group V anion precursors. In certain of such embodiments, the method can further include adjusting the temperature after reaction of precursors is initiated to a second temperature sufficient to grow nanocrystals. In certain of such embodiments, the method can further include isolating the nanocrystals from the reaction mixture.

Semiconductor nanocrystals can comprise one or more semiconductor materials. Examples of semiconductor materials include, but are not limited to, Group II-VI compounds (e.g., binary, ternary, and quaternary compositions), Group II-V compounds (e.g., binary, ternary, and quaternary compositions), Group III-VI compounds (e.g., binary, ternary, and quaternary compositions), Group III-V compounds (e.g., binary, ternary, and quaternary compositions), Group IV-VI compounds (e.g., binary, ternary, and quaternary compositions), Group I-III-VI compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, and alloys including any of the foregoing, and/or a mixture including any of the foregoing. Semiconductor nanocrystals can also comprise one or more semiconductor materials that comprise ternary and quaternary alloys that include one or more of the foregoing compounds.

A non-limiting list of examples include ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TlN, TlP, TlAs, TlSb, PbO, PbS, PbSe, PbTe, Ge, Si, an alloy including any of the foregoing, and/or a mixture or alloy including any of the foregoing, including ternary and quaternary mixtures or alloys.

As used herein, "cation" refers to a metal element (e.g., a Group I (e.g., Cu, Ag, Au), Group II (e.g., Mg, Zn, Cd, Hg), Group III (e.g., B, Al, Ga, In, Tl), or Group IV (e.g., Si, Ge, Sn, Pb) element) included in a semiconductor nanocrystal; wherein the valence of the element can include zero. As used herein, "anion" refers to a non-metal element (e.g., a Group V (e.g., N, P, As, Sb, Bi) or Group VI (e.g., O, S, Se, Te) element) included in a semiconductor nanocrystal); wherein the valence of the element can include zero.

The size and composition of a semiconductor nanocrystal affects its characteristic spectral emission wavelength. Thus, the size and composition of a semiconductor nanocrystal is readily selected by one of ordinary skill in the art such that the semiconductor nanocrystal emits photons at a predetermined wavelength in the desired portion of the spectrum.

In certain embodiments, a semiconductor nanocrystal can comprise a semiconductor material comprising one or more elements of Group III (e.g., B, Al, Ga, In, Tl) and one or more elements of Group V (e.g., N, P, As, Sb, Bi) (e.g., binary, ternary, and quaternary III-V compositions).

Examples of Group III cation precursors include Group III elements, covalent compounds, ionic compounds, and/or coordination complexes, that serve as a source for a Group III element(s) in the resulting nanocrystal. For example, a Group III cation precursor can constitute a wide range of substances, including, but not limited to, a metal oxide, a metal carbonate, a metal bicarbonate, a metal sulfate, a metal sulfite, a metal phosphate, metal phosphite, a metal halide, a metal carboxylate, a metal alkoxide, a metal thiolate, a metal amide, a metal imide, a metal alkyl, a metal aryl, a metal coordination complex, a metal solvate, and the like. For example, non-limiting examples of indium precursors include In(III) acetate, In(III) trifluoroacetate, trialkyl indium ($InR_3$) (wherein R=methyl, ethyl, propyl, butyl, pentyl, hexyl, isopropyl, isobutyl, tert-butyl, etc.). Other Group III cation precursors can be readily ascertained by one of ordinary skill in the art.

Examples of Group V anion precursors include elements, covalent compounds, or ionic compounds that serve as a source for a Group V element(s) in the resulting nanocrystal. Group V precursors are most often selected from the Group V elements themselves (oxidation state 0), covalent compounds, or ionic compounds of the group V elements (N, P, As, or Sb). For example, non-limiting examples of phosphorus precursors include $P(SiR_3)_3$ wherein R=methyl, ethyl, propyl, butyl, pentyl, hexyl, isopropyl, isobutyl, tert-butyl, etc.). Other Group V precursors can be readily ascertained by one of ordinary skill in the art.

In certain embodiments, semiconductor nanocrystals comprising binary materials, ternary materials, quaternary materials, and even more complex species may be prepared using the methods described herein, in which case more than one cation precursor and/or more than one anion precursor may be included.

In certain embodiments, a semiconductor nanocrystal can include a semiconductor material comprising one or more elements of Group III and one or more elements of Group V (e.g., binary, ternary, and quaternary III-V compositions).

In certain embodiments, a semiconductor nanocrystal can include a semiconductor material comprising one or more elements of Group II and one or more elements of Group VI (e.g., binary, ternary, and quaternary II-VI compositions).

A semiconductor nanocrystal may also be referred to herein as a semiconductor nanoparticle, a nanocrystal, or a quantum dot.

A semiconductor nanocrystal is capable of emitting light upon excitation. A semiconductor nanocrystal can be excited by irradiation with an excitation wavelength of light, by electrical excitation, or by other energy transfer.

Photoluminescence quantum efficiency (also referred to as quantum efficiency, quantum yield or solution quantum yield) represents the percent of absorbed photons that are reemitted as photons upon excitation by irradiation with an excitation wavelength of light.

A nanocrystal is a nanometer sized particle, e.g., in the size range of up to about 1000 nm. In certain embodiments, a nanocrystal can have a size in the range of up to about 100 nm. In certain embodiments, a nanocrystal can have a size in the range up to about 20 nm (such as about 1, 2, 3, 4, 5, 6, 7, 8, 9, 10, 11, 12, 13, 14, 15, 16, 17, 18, 19, or 20 nm). In certain embodiments, a nanocrystal can have a size less than 100 Å. In certain embodiments, a nanocrystal has a size in a range from about 1 to about 6 nanometers and more particularly from about 1 to about 5 nanometers. The size of a nanocrystal can be determined, for example, by direct transmission electron microscope measurement. Other known techniques can also be used to determine nanocrystal size.

Nanocrystals can have various shapes. Examples of the shape of a nanocrystal include, but are not limited to, sphere, rod, disk, tetrapod, other shapes, and/or mixtures thereof.

A semiconductor nanocrystal can further include an overcoating or shell over at least a portion of, and preferably all of, the outer surface of the semiconductor nanocrystal. In certain embodiments, the shell comprises one or more semiconductor materials. In certain embodiments, the one or more additional semiconductor materials are different from the semiconductor material included in the nanocrystal core. In certain embodiments, a shell can comprise two or more layers of the same or different semiconductor materials. In certain embodiments, a layer can include a single semiconductor material or a mixture of two or more semiconductor materials with different compositions, particle sizes, and/or emission characteristics. A semiconductor material may comprise a compound, a doped compound, and/or an alloy. A nanocrystal core surrounded by a shell is also referred to as having a "core/shell" structure.

In accordance with another aspect of the present invention, there is provided a method for forming a coating on at least a portion of a population of semiconductor nanocrystals, the method comprising: forming a first mixture including a population of semiconductor nanocrystals, one or more amine compounds, and a first solvent; adding one or more cation precursors and one or more anion precursors to the first mixture, wherein the temperature of the first mixture during addition of the precursors is sufficient for growing a semiconductor material comprising one or more of the cations and one or more of the anions on at least a portion of an outer surface of at least a portion of the population of semiconductor nanocrystals; and initiating addition of one or more acids to the first mixture after addition of the cation and anion precursors is initiated.

In certain embodiments, the one or more acids are added at a predetermined rate.

In certain embodiments, one or more acids are added to the first mixture as a solution further comprising a solvent.

In certain embodiments, at least one of the one or more acids comprises a phosphonic acid compound.

In certain embodiments, each of the one or more acids comprises a phosphonic acid compound.

In certain embodiments, one or more one of the acids comprises a phosphonic acid compound that further comprises one or more aromatic groups. In certain of such embodiments, the phosphonic acid compound further comprising one or more aromatic groups is added to the first mixture as a solution further comprising an aromatic solvent, such as, for example, but not limited to, diphenylbenzene, 1-dodecyl-2-pyrrolidinone, etc.

In certain embodiments, one or more one of the acids comprises a phosphonic acid compound that further comprises one or more aromatic groups and one or more of the amine compounds further comprises one or more aromatic groups.

In certain embodiments, one or more of the acids comprise a phosphonic acid compound that further comprises one or more alkyl groups. In certain of such embodiments, the phosphonic acid compound further comprising one or more alkyl groups is added to the first mixture as a solution further comprising a non-aromatic non-coordinating or weakly coordinating solvent.

In certain embodiments, one or more one of the acids comprises a phosphonic acid compound that further comprises one or more alkyl groups and one or more of the amine compounds further comprises one or more alkyl groups.

In certain embodiments, a phosphonic acid compound comprises a ligand.

Examples of phopshonic acid compounds including, but are not limited to, benzylphosphonic acid, benzylphosphonic acid including at least one substituent group on the ring of the benzyl group, a conjugate base of such acids, and mixtures including one or more of the foregoing. In certain embodiments, a ligand comprises 4-hydroxybenzylphosphonic acid, a conjugate base of the acid, and a mixture of the foregoing. In certain embodiments, a phopshonic acid compounds comprises 3,5-di-tert-butyl-4-hydroxybenzylphosphonic acid, a conjugate base of the acid, or a mixture of the foregoing. Other examples include, but are not limited to, cyclohexylmethylphosphonic acid, phenylphosphonic acid, 2-methylbenzylphosphonic acid, 4-methoxybenzylphosphonic acid, 2-benzyloxyethyl phosphonic acid, 2-naphtalenylmethyl)phosphonic acid, benzylpyrophosphonic acid, etc.

In certain embodiments, at least one of the one or more acids comprises a carboxylic acid compound.

In certain embodiments, each of the one or more acids comprises a carboxylic acid compound.

In certain embodiments, a carboxylic acid compound comprises a ligand.

Examples of carboxylic acid compounds include, but are not limited to, $CH_3(CH_2)_nC(O)OH$ wherein n=1-18 (e.g., octanoic [caprylic] acid, nonanoic [pelargonic] acid, decanoic [capric] acid, undecanoic acid, dodecanoic [lauric] acid, tridecanoic acid, tetradecanoic [myristic] acid, pentadecanoic acid, hexadecanoic [palmitic] acid, heptadecanoic [margaric] acid, octadecanoic [stearic] acid, nonadecanoic acid, eicosanoic [arachidic] acid). In certain embodiments, a carboxylic acid compound comprises oleic acid. In certain embodiments, a carboxylic acid compound includes an aromatic group.

In certain embodiments, mixtures of different acids can be included.

In certain embodiments, the addition of the one or more acids is a stepwise addition.

In certain embodiments, the temperature is in a range from about 150° C. to about 350° C.

In certain embodiments, the temperature is in a range from about 150° C. to about 300° C.

In certain embodiments, the temperature is in a range from about 200° C. to about 250° C.

In certain embodiments, the temperature is about 250° C.

In certain embodiments, at least one of the one or more amine compounds comprises a primary amine.

In certain embodiments, each of the one or more amine compounds comprises a primary amine.

In certain embodiments, at least one of the one or more amine compounds comprises a secondary amine.

In certain embodiments, each of the one or more amine compounds comprises a secondary amine.

In certain embodiments, at least one of the one or more amine compounds comprises a tertiary amine.

In certain embodiments, each of the one or more amine compounds comprises a tertiary amine.

In certain embodiments including one or more amine compounds, a mixture of amines, (e.g., but not limited to, primary amines and secondary amines) can be included.

In certain embodiments, an amine compound comprises a ligand.

Examples of amine compounds include, but are not limited to, primary amines, e.g., $CH_3(CH_2)_nNH_2$ wherein n=4-19 (e.g., butylamine, pentylamine, hexylamine, heptylamine, octylamine, nonylamine, decylamine, undecylamine, dodecylamine, tridecylamine, tetradecylamine, pentadecylamine, hexadecylamine, heptadecylamine, octadecylamine, nonadecylamine, eicosylamine), and secondary amines, e.g., $(CH_3(CH_2)_n)_2NH$ wherein n=3-11 (e.g., dibutylamine, dipentylamine, dihexylamine, diheptylamine, dioctylamine, dinonylamine, didecylamine, diundecylamine, didodecylamine), etc. In certain embodiments, an amine comprises, for example, but not limited to, decylamine, octadecylamine, and oleylamine. Other nonlimiting examples include 2-ethylhexyl amine and ethanolamine. In certain embodiments, an amine compound comprises a phenyl alkyl amine (e.g., but not limited to, phenylbutyl amine). In certain embodiments, an amine compound comprises 4-phenylbutyl amine, 3,3-diphenylpropylamine, (2,3-diphenylpropyl)amine, etc. In certain embodiments, an amine compound comprises an aliphatic amine. In certain embodiments, an amine compound has a boiling point greater than 200° C. Other amines compounds can be readily ascertained by one of ordinary skill in the art.

In certain embodiments, the one or more cation precursors and one or more anion precursors are added separately.

In certain embodiments, the one or more cation precursors are added separately from the one or more anion precursors.

In certain embodiments, the one or more cation precursors and one or more anion precursors are added concurrently.

In certain embodiments, the addition of the one or more cation precursors and the one or more anion precursors is a stepwise addition.

In certain embodiments, the one or more cation precursors and one or more anion precursors are added at a predetermined rate.

In certain embodiments, the one or more cation precursors are included in a solution further including a solvent.

In certain embodiments, the one or more anion precursors are included in a solution further comprising a solvent.

In certain embodiments, the population of semiconductor nanocrystals included in the first mixture comprise semiconductor nanocrystals prepared in accordance with a method taught herein comprising: adding one or more cation precursors and one or more anion precursors to a mixture including one or more acids, one or more phenol compounds, and a solvent to form a reaction mixture, and heating the reaction mixture at a temperature and for a period of time sufficient to produce semiconductor nanocrystals having a predetermined composition.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more acids to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more phosphonic acid compounds to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

In certain embodiments, a method for preparing semiconductor nanocrystals comprises reacting one or more core cation precursors and one or more core anion precursors in a reaction mixture including one or more phenol compounds, one or more amine compounds, and one or more acids to form nanocrystal cores; isolating nanocrystal cores from the reaction mixture; forming a second mixture including at least a portion of the isolated nanocrystal cores, one or more amine compounds, and a solvent; adding one or more overcoat cation precursors and one or more overcoat anion precursors to the second mixture, wherein the temperature of the second mixture during addition is sufficient to form an overcoat material comprising one or more cations and one or more anions on a surface of at least a portion of the isolated nanocrystal cores in the second mixture; and initiating addition of one or more carboxylic acid compounds to the second mixture after addition of the overcoat cation and overcoat anion precursors is initiated. In certain of such embodiments, the temperature of the second mixture is in a range form about 150° C. to 350° C. In certain of such embodiments, the temperature of the second mixture is in a range form about 150° C. to 300° C. In certain of such embodiments, the temperature of the second mixture is in a range form about 200° C. to 250° C.

Examples of solvents include, but are not limited to, octadecene, squalene, methyl myristate, octyl octanoate, hexyl octanoate, and $CH_3(CH_2)_nC(O)O(CH_2)_mCH_3$ wherein n=4-18 and m=1-8, dioctyl ether, and diphenyl ether, and mixtures of one or more solvents. In certain embodiments, a mixture can comprise a mixture, (including but not limited to a eutectic mixture) of biphenyl and diphenyl oxide, including, e.g., DOWTHERM A, available from the Dow Chemical Company. Other high boiling point ethers (e.g., BP>~200° C.) may also be used. Such ethers (coordinating) can be aromatic ethers, aliphatic ethers or aromatic aliphatic ethers. Examples of additional ethers include, but are not limited to, dihexyl ether, diethyleneglycol dimethyl ether, diethyleneglycol dibutyl ether, triethyleneglycol dimethyl ether, tetraethyleneglycol dimethyl ether, butyl phenyl ether, benzyl phenyl ether, dibenzyl ether, ditolyl ether and isomers thereof. Mixtures of two or more solvents can also be used. Other coordinating solvents can be readily ascertained by one of ordinary skill in the art.

Examples of non-coordinating solvents for use in the methods taught herein include, but are not limited to, squalane, octadecane, or any other saturated hydrocarbon molecule. Mixtures of two or more solvents can also be used. Other non-coordinating solvents for use in the methods taught herein can be readily ascertained by one of ordinary skill in the art. In certain embodiments, non-coordinating solvents comprise liquids having a dipole moment in the range form 0 to about 0.2 μ/D. In certain embodiments, weakly coordinating solvents can be used. In certain embodiments, weakly coordinating solvents comprise liquids having a dipole moment in the range from 0.2 to 0.7 μ/D.

In certain embodiments including a phosphonic acid compound further including one or more aromatic groups, the first solvent can comprise an aromatic solvent. Examples of aromatic solvents include, but are not limited to, tri-phenyl phosphine oxide, tri-phenyl phosphine, o-terphenyl, m-terphenyl, and p-terphenyl, etc. Other aromatic solvents with a boiling point greater than 250° C. that will not react with the semiconductor nanocrystals or ligands can also be identified by one of ordinary skill in the art.

In certain embodiments including a phosphonic acid compound further including one or more alkyl groups, the first solvent can comprise squalane, TOP, other aliphatic solvents, etc.

In certain preferred embodiments, a phosphonic acid compound comprising benzyl phosphonic acid and an amine compound comprising phenylbutyl amine are used. In certain of such embodiments, the first solvent comprises a mixture of o-terphenyl and squalane in a 4:1 weight percent ratio.

In another embodiment, a phosphonic acid compound comprising octadecyl phosphonic acid and an amine compound comprising decyl amine are used. In certain of such embodiments, the first solvent comprises TOP or squalane or other aliphatic solvent.

Examples of semiconductor materials for inclusion in a shell include, but are not limited to, a semiconductor material comprising one or more elements of Group II and one or more elements of Group VI (e.g., binary, ternary, and quaternary II-VI compositions). Other non-limiting examples of semiconductor materials include a semiconductor material comprising one or more elements of Group III and one or more elements of Group V (e.g., binary, ternary, and quaternary III-V compositions), Group IV-VI compounds (e.g., binary, ternary, and quaternary compositions), Group compounds (e.g., binary, ternary, and quaternary compositions), Group II-IV-VI compounds (e.g., binary, ternary, and quaternary compositions), Group II-IV-V compounds (e.g., binary, ternary, and quaternary compositions), Group IV elements, an alloy including any of the foregoing, and/or a mixture including any of the foregoing.

Shell thickness can be varied by growing a desired thickness of the shell. For example, the shell can have a thickness less than about one monolayer, about one monolayer, or more than about one monolayer. Preferably, the thickness is less than that at which quantum confinement is not achieved. The thickness is selected to achieve the predetermined characteristics of the core/shell nanocrystal. In certain embodiments, the thickness is in the range from greater than about 0 to about 20 monolayers. In certain embodiments, the thickness is in the range from greater than about 0 to about 10 monolayers. In certain embodiments, the thickness is in the range from greater than about 0 to about 5 monolayers. In certain embodiments, the thickness is in the range from about 1 to about 5 monolayers. In certain embodiments, the thickness is in the range from about 3 to about 5 monolayers. In certain embodiments, more than 20 monolayers can be grown.

In certain embodiments, a nanocrystal includes a shell formed over at least a portion, and preferably all, of the outer surface thereof.

In certain embodiments, the nanocrystal is isolated from the reaction mixture. In certain embodiments, isolated nanocrystals are purified before the shell is formed.

In certain embodiments, the shell can be formed over at least a portion of the core with prior isolation and/or purification of the core. In certain embodiments of the latter case, the formation of the shell can be carried out in the same reaction vessel in which the core is formed.

In certain embodiments, a nanocrystal further includes one or more ligands attached to the surface of the nanocrystal.

In certain embodiments, a nanocrystal core, and/or a nanocrystal shell comprises a colloidal growth process. Colloidal growth occurs by injection a cation precursor and an anion precursor into a hot solvent. This permits discrete nucleation and results in the controlled growth of macroscopic quantities of nanocrystals. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals that can be obtained has a narrow, monodisperse distribution of particle sizes. The monodisperse distribution of particles can also be referred to as a size. Preferably, a monodisperse population of particles includes a population of particles wherein at least about 60% of the particles in the population fall within a specified particle size range. A population of monodisperse particles preferably deviate less than 15% rms (root-mean-square) in particle size and more preferably less than 10% rms and most preferably less than 5%.

A narrow size distribution of the nanocrystals comprising semiconductor material allows the possibility of light emission in narrow spectral widths. Monodisperse semiconductor nanocrystals have been described in detail in Murray et al. (J. Am. Chem. Soc., 115:8706 (1993)); in the thesis of Christopher Murray, "Synthesis and Characterization of II-VI Quantum Dots and Their Assembly into 3-D Quantum Dot Superlattices", Massachusetts Institute of Technology, September, 1995; and in U.S. patent application Ser. No. 08/969,302 for "Highly Luminescent Color-Selective Materials". The foregoing documents are hereby incorporated herein by reference in their entireties.

The process of controlled growth and annealing of nanocrystals in a solvent that follows nucleation can also result in uniform surface derivatization and regular structures. As the size distribution sharpens, the temperature can be raised to maintain steady growth. By adding more cation precursor or anion precursor, the growth period can be shortened. As mentioned above, a cation precursor can be an inorganic compound, an organometallic compound, or elemental metal. For example, in preparing a semiconductor material represented by the general formula MX, wherein the semiconductor material comprises one or more Group III cation precursors (represented by M in the above general formula) comprises one or more of boron, aluminum, gallium, indium, and thallium. Additional chemical elements can optionally be further included. In preparing other semiconductor materials, the cation precursor is selected based on the composition of the desired semiconductor material. The anion precursor is a compound capable of reacting with the cation precursor to form a material with the general formula MX. For example, in preparing a semiconductor material comprising a Group V, element, X comprises one or more of nitrogen, phosphorus, arsenic, antimony, or bismuth. In preparing other semiconductor materials, X is selected based on the composition of the desired semiconductor material. For example, X donor can be a chalcogenide (Group VI) donor or a pnictide (Group V) donor, such as a phosphine chalcogenide, a bis(silyl) chalcogenide, dioxygen, an ammonium salt, or a tris(silyl) pnictide. Examples of suitable X donors include, but are not limited to, dioxygen, bis(trimethylsilyl) selenide ((TMS)$_2$Se), octadecene-Se, trialkyl phosphine selenides such as (tri-n-octylphosphine) selenide (TOPSe) or (tri-n-butylphosphine) selenide (TBPSe), octadecene-Te, trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), octadecene-S, bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH4Cl), tris(trimethylsilyl) phosphide ((TMS)$_3$P), tris(trimethylsilyl) arsenide ((TMS)$_3$As), or tris(trimethylsilyl) antimonide ((TMS)$_3$Sb). In certain embodiments, the M donor (e.g., cation precursor) and the X donor (e.g., anion precursor) can be moieties within the same molecule.

Size distribution during the growth stage of the reaction can be estimated by monitoring the absorption or emission line widths of the particles. Modification of the reaction temperature in response to changes in the absorption spectrum of the particles allows the maintenance of a sharp particle size distribution during growth. Reactants can be added to the nucleation solution during crystal growth to grow larger crystals as well as to sharpen size distribution. For example, by stopping growth at a particular semiconductor nanocrystal average diameter, a population having an average semiconductor nanocrystal diameter of less than 150 Å can be obtained. A population of nanocrystals can have an average diameter of 15 Å to 125 Å. In addition, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm.

Optionally, the particle size distribution of the nanocrystals can be further refined by size selective precipitation with a poor solvent for the nanocrystals, such as, for example, methanol/butanol. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population preferably has no more than a 15% rms deviation from mean particle size, more preferably 10% rms deviation or less, and most preferably 5% rms deviation or less.

In certain embodiments, the nanocrystal emission includes a maximum peak emission with a full width at half maximum (FWHM) of not more than 70 nm, not more than 60 nm, not more than 50 nm.

Transmission electron microscopy (TEM) can provide information about the size, shape, and distribution of the semiconductor nanocrystal population. Powder X-ray diffraction (XRD) patterns can provide the most complete information regarding the type and quality of the crystal structure of the semiconductor nanocrystals. Estimates of size are also possible since particle size is inversely related, via the X-ray coherence length, to the peak width. For example, the diameter of the semiconductor nanocrystal can be measured directly by transmission electron microscopy or estimated from X-ray diffraction data using, for example, the Scherrer equation. It also can be estimated from the UV/Vis absorption spectrum.

As discussed herein, nanocrystals preferably have ligands attached thereto.

Examples of ligands include, but are not limited to, fatty acids and other carboxylic acid compounds, phosphonic acid compounds, amine compounds, phosphines, phosphine oxides, etc.

In certain embodiments, the reaction is carried out in an inert atmosphere, where exposure to air is substantially, and preferably completely, precluded.

In accordance with another aspect of the present invention, there is provided semiconductor nanocrystal, prepared in accordance with one or more methods described herein, comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further including one or more aromatics group and an amine compound further including one or more aromatic groups.

In certain preferred embodiments, the ligands comprise phenylbutyl amine and benzylphosphonic acid.

In accordance with another aspect of the present invention, there is provided population of semiconductor nanocrystals including semiconductor nanocrystal comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further including one or more aromatics group and an amine compound further including one or more aromatic groups, wherein the solution quantum yield of the population is at least 70%.

In accordance with another aspect of the present invention, there is provided a population of semiconductor nanocrystals comprising a semiconductor nanocrystal comprising a core comprising at first semiconductor material comprising at least one Group III element and at least one Group V element and a shell disposed over at least a portion of an outer surface of the core, wherein the shell comprising a second semiconductor material that is different from the first semiconductor material, and ligands attached to an outer surface of the shell, wherein the ligands comprise a phosphonic acid compound further and an amine compound, wherein the solution quantum yield of the population is at least 70%.

In certain preferred embodiments, the ligands comprise decyl amine and octadecyl phosphonic acid.

The present invention will be further clarified by the following non-limiting examples, which are intended to be exemplary of the present invention.

EXAMPLES

Example 1

Preparation of Semiconductor Nanocrystals with Benzylphosphonic Acid Capable of Emitting 626 nm Light A. Synthesis of InP Cores:

50.8 mmol myristic acid is added to 200 ml of squalane in a 0.5 L glass reactor. The reaction mixture is dried and degassed at 100° C. for one hour. The reaction mixture is then allowed to cool to 70° C. 5.37 mmol of 2,2'-biphenol is added and the mixture is degassed again for 30 minutes. The reactor is backfilled with nitrogen and the temperature is set to 195° C. 16.89 mmol of trimethylindium, 5.17 mmol of dioctylamine, 8.44 mmol of tris(trimethylsilyl)phosphine, 117 mmol diphenyl and 294 mmol diphenylether are combined into a single In/P solution. The InP solution is split evenly into two 55 ml syringe barrels. When the reactor temperature reaches 195° C., the In/P solution is then rapidly injected from the 2 syringes into the reactor. The temperature controller is immediately set to a 170° C. growth temperature. The reaction mixture is heated at 170° C. for 25 minutes at which point the heating mantle is removed from the reaction flask and the mixture is allowed to cool to room temperature. The InP cores are precipitated out of the growth solution inside a nitrogen atmosphere glovebox by adding 600 ml isopropanol.

An example of a sample of isolated cores dispersed in hexane prepared substantially in accordance with the procedure described in Example 1A demonstrated the following characteristics: (Abs/Emission/FWHM (nm)=570/603/51)

B. Synthesis of InP/ZnS Core-Shell Nanocrystals:

160 grams of o-terphenyl (1,2-diphenylbenzene) and 40 mL of squalane are loaded into a 500 mL glass reactor. The reactor and its contents are heated to 75° C. during degassing for an hour, and it is back-filled with nitrogen. 56.7 mL of InP nanocrystals (prepared substantially in accordance with the core preparation described in Example 1A) is added under nitrogen flow and hexane is removed under vacuum. Meanwhile, 8.2 grams of benzylphosphonic acid (BPA, obtained from PCI SYNTHESIS, Newburyport, Mass.) and 40 mL of 1-dodecyl-2-pyrrolidinone (NDP) are mixed into a round bottom flask with gently heating to dissolve BPA. The solution is pumped under vacuum for an hour at 40° C., and it is loaded in a syringe. Diethylzinc, and hexamethyldisilathiane are used as the Zn, and S precursors, respectively. Each of 15.76 mmol of diethylzinc and 15.76 mmol of hexamethyldisilathiane is dissolved in 42 mL of squalane inside a nitrogen atmosphere glove box, and it is loaded in a separate syringe. Once all hexane is removed from the reactor, it is back-filled with nitrogen. Once the reactor, BPA/NDP solution, and precursor solution are ready, 10 mL of phenylbutyl amine is added to the reactor and the reactor is heated to 250° C. The full amounts of the Zn and S solutions are added dropwise at an even rate to the reactor solution over the course of 2 hours at 250° C. using a syringe pump. Thirty minutes after the start of the Zn/S addition, the BPA/NDP addition is begun. The full amount of the BPA/NDP solution is added by a syringe pump to the reactor at an even rate to the reactor over a one hour period. After the shell growth, the nanocrystals are transferred to a nitrogen atmosphere glovebox and precipitated out of the growth solution by adding isopropanol. The resulting precipitates are then dispersed in toluene and precipitated out of solution for a second time by adding a 1:1:1 mixture of butanol, isopropanol and hexane.

An example of a sample of isolated core-shell nanocrystals dispersed in toluene prepared substantially in accordance with the procedure described in Example 1B demonstrated the following characteristics: (Abs/Emission/FWHM (nm)=588/626/57) and an 84% QY (against a red standard (see below)).

Example 2

Indium Phosphide Based Green-Emitting Quantum Dots

The synthesis of the green InP core is based on modifications on the red core synthesis described in Example 1. As described in Example 1, red InP cores are synthesized by injection of a solution of trimethyl indium, dioctyl amine, and tris(trimethylsilyl)phosphine in Dowtherm A into a heated solution including myristic acid and 2,2'-biphenol in squalane. The peak wavelength of the emission of the InP cores usually reaches around. 600 nm within 30 minutes after the injection of precursors. In order to reduce the size of the InP cores so as to shift the emission wavelength to 510 to 530 nm range, phenols that can reduce the reaction rates and provide good quality nanocrystal are used in place of 2,2'-biphenol. Of 2,2'-dihydroxybenzophenone, 2,4-di-tert-butylphenol, 2-phenylphenol, 2,6-diphenylphenol, 2,2'-dihydroxybenzophenone is preferred for shifting emission to shorter wavelength. Initial results for 2,4-di-tert-butylphenol and 2,6-diphenylphenol indicate slowed core growth with poor core quality. Initial results for 2-phenylphenol indicate difficulty in shifting emission of the core to below 530 nm.

Chemical structures for 2,2'-dihydroxybenzophenone, 2,4-di-tert-butylphenol, 2-phenylphenol, and 2,6-diphenylphenol are shown in FIG. 1.

Figure 2:
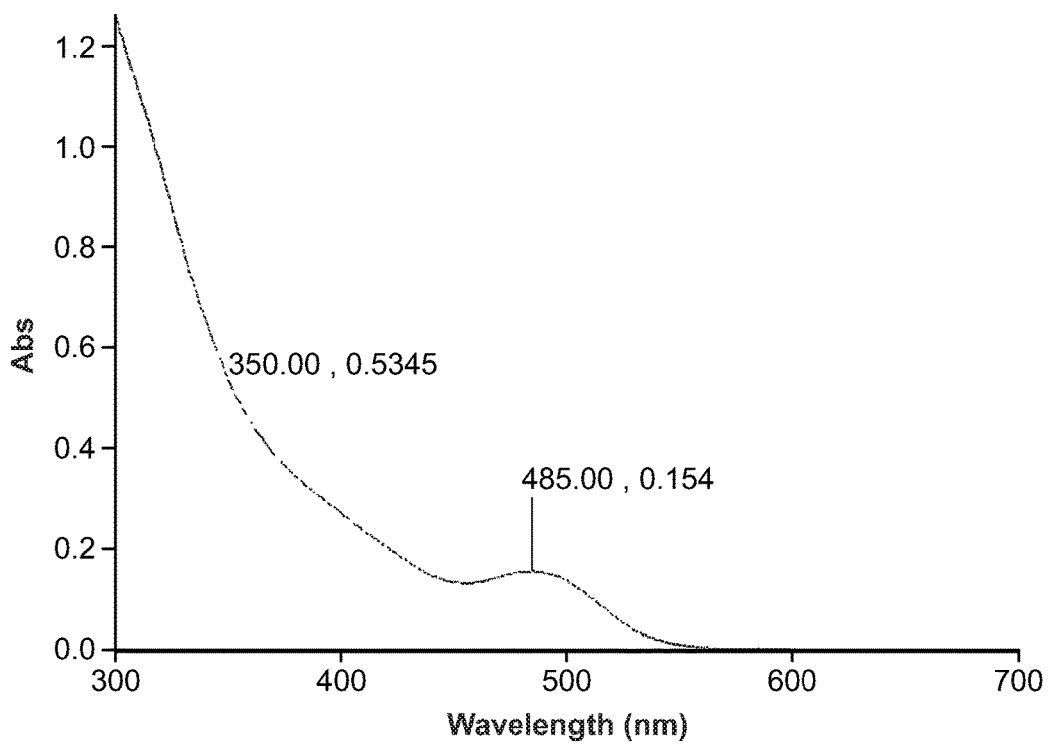
FIG. 2 illustrates an absorption spectrum of an example of semiconductor nanocrystal of the present invention.

In a representative synthesis of InP green core, myristic acid (0.887 g) and 2,2'-dihydroxybenzophenone (0.253 g) are weighed out into a 50 mL three neck flask equipped with a stir bar, thermocouple temperature probe, condenser with $N_2$/vacuum inlet/outlet, and septa on the remaining neck. Dry squalane (10 mL) is added. The reaction vessel is heated to 100° C. and degassed for 1 hour, and backfilled with nitrogen. The temperature of the solution is increased to 215° C., and the temperature controller is set to 190° C. When the temperature is dropped to 210° C., a solution of $InMe_3$, dioctylamine, $P(TMS)_3$ in DowThermA (prepared from 26.5% biphenyl and 73.5% diphenyl ether, 6 mL) prepared in the glovebox is rapidly injected via a syringe. After being heated at 190° C. for 4 hours, the temperature is set to 100° C. and the reaction is heated at this temperature for 16 hours. Precipitation of nanocrsytals is performed by adding butanol/methanol, 3:1 (c.a. 3 fold of the reaction volume). The precipitate is separated by centrifuging, and re-dissolved in hexanes. The core solution is then filtered through a 0.2µ membrane. A representative absorption spectrum of the green InP core is shown in FIG. 2. It has first absorption peak around 480 nm.

Figure 3:
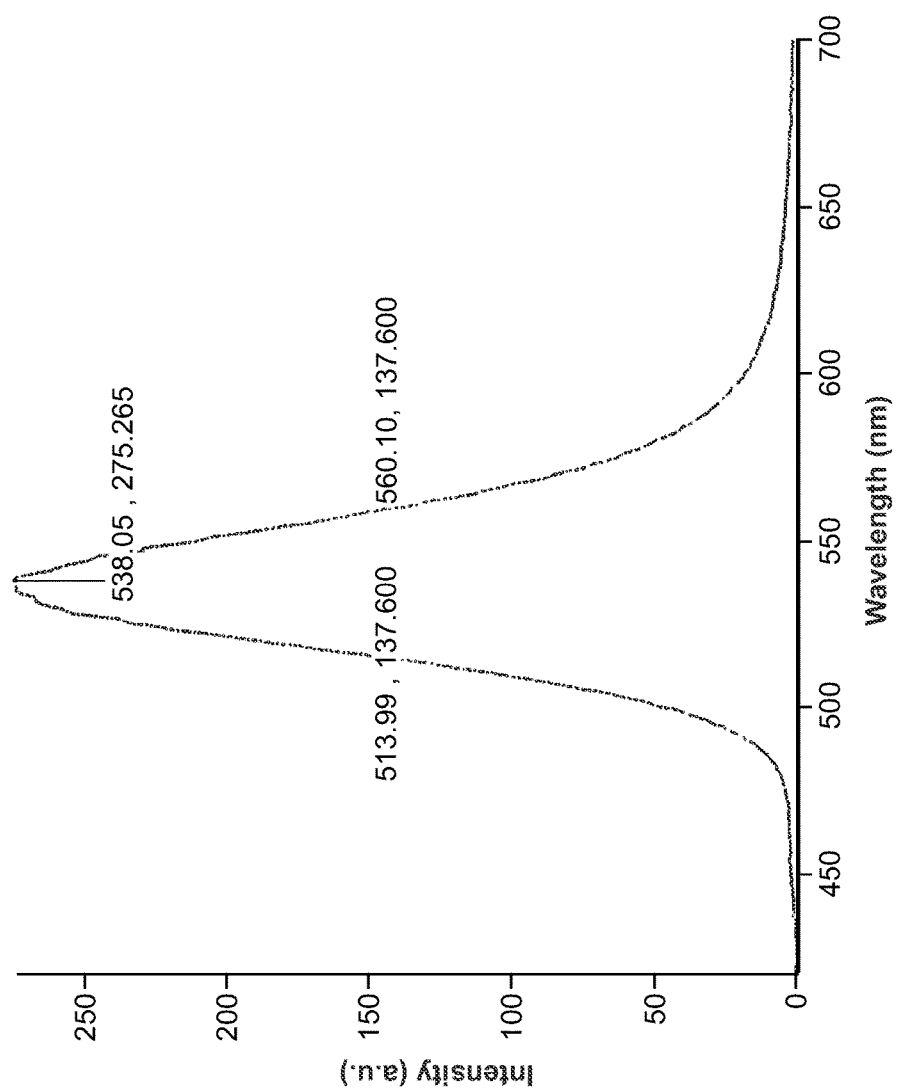
FIG. 3 illustrates an emission spectrum of an example of semiconductor nanocrystal of the present invention.
Figure 4:
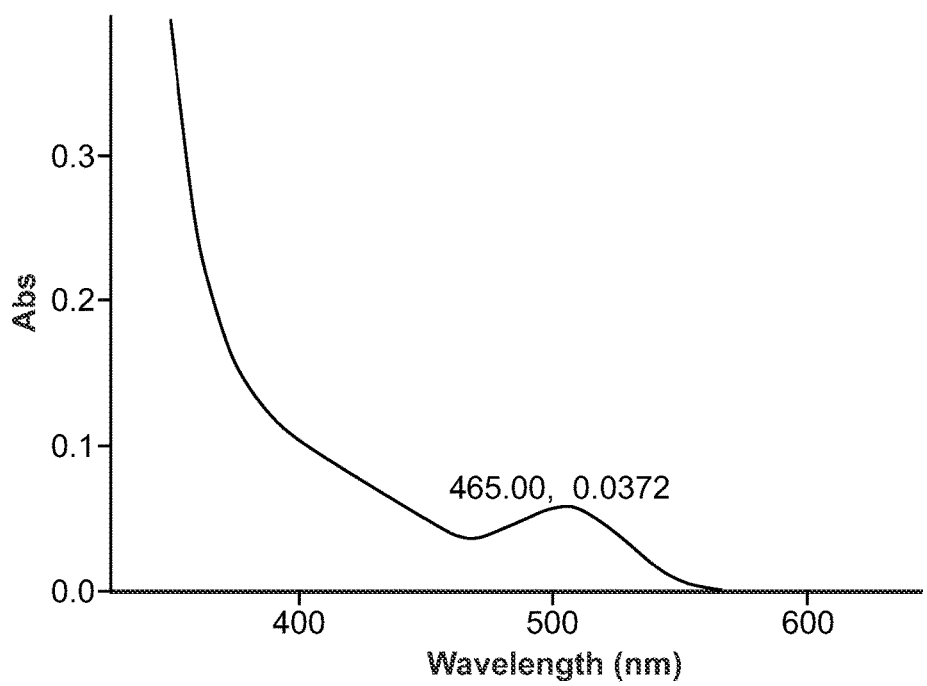
FIG. 4 illustrates an absorption spectrum of an example of semiconductor nanocrystal of the present invention.

The overcoating of the green InP core with ZnS is performed by a slow infusion by a syringe pump at an even rate of diethyl zinc and hexamethyldisilthiane in tri-n-octyl phosphine, and a sequential addition of n-octylphosphonic acid or benzylphosphonic acid. The emission spectrum of a representative green emitting core/shell InP/ZnS quantum dots is shown in FIG. 3 and the absorption spectrum of a representative green emitting core/shell InP/ZnS quantum dots is shown in FIG. 4. It has an emission maximum of 548 nm and emission FWHM of 53 nm, and a quantum yield of 51%. A distinctive first excitonic absorption is indicative of good core crystallinity. Thermal gravimetric analysis (TGA) on a representative dried sample of green emitting indicates a high inorganic content (e.g., 73%) and thus high purity.

To examine the stability of the green emitting quantum dots, a representative sample of the InP/ZnS core/shell material (with emission maximizing at 548 nm, FWHM of 53 nm, and a quantum yield of 51% in hexanes) is coated as thin films onto glass substrates. Some of the films are encapsulated in glovebox by covering the film with a second piece of glass and sealing the two pieces of glass together with epoxy. Both un-encapsulated and encapsulated films are placed in a 50° C. chamber with constant blue light radiation. The photoluminescence intensity of the samples is then monitored as a function of time. The fluorescence intensity of the encapsulated samples remains at a level similar to its initial values within the first 200 hours of blue light exposure and heating. These observations indicate that the InP/ZnS green core/shell quantum dots can be significantly stabilized by being kept in an oxygen/water free environment. In the presence of oxygen and/or water, these quantum dots can degrade rapidly when irradiated with blue light and heated.

Example 3

Preparation of Semiconductor Nanocrystals with Benzylphosphonic Acid Capable of Emitting 630 nm Light A. Synthesis of InP Cores:

50.8 mmol myristic acid is added to 200 ml of squalane in a 0.5 L glass reactor. The reaction mixture is dried and degassed at 100° C. for one hour. The reaction mixture is then allowed to cool to 70° C. 5.37 mmol of 2,2'-biphenol is added and the mixture is degassed again for 30 minutes. The reactor is backfilled with nitrogen and the temperature is set to 195° C. 16.89 mmol of trimethylindium, 5.17 mmol of dioctylamine, 8.44 mmol of tris(trimethylsilyl)phosphine, 117 mmol diphenyl and 294 mmol diphenylether are combined into a single In/P solution. The In/P solution is split evenly into two 55 ml syringe barrels. When the reactor temperature reaches 195° C., the In/P solution is then rapidly injected from the 2 syringes into the reactor. The temperature controller is immediately set to a 170° C. growth temperature. The reaction mixture is heated at 170° C. for 25 minutes at which point the heating mantle is removed from the reaction flask and the mixture is allowed to cool to room temperature. The InP cores are precipitated out of the growth solution inside a nitrogen atmosphere glovebox by adding 750 ml Butanol/Isopropanol (3:1 ratio).

An example of a sample of isolated cores dispersed in hexane prepared substantially in accordance with the procedure described in Example 3A demonstrated the following characteristics: (Abs/Emission/FWHM (nm)=583/600/59)

B. Synthesis of InP/ZnS 160 g of 1,2-diphenylbenzene and 40 ml of Squalane are loaded into a 0.5 L glass reactor. The mixture is then dried and degassed in the reactor by heating to 75° C. for about an hour. 47.67 mmol (8.2 g) of benzylphosphonic acid (BPA) is added to 160 g of 1,2-diphenylbenzene in a 250 ml flask and degassed at 100° C. for 1 hour. A hexane solution containing the isolated InP cores (InPC-080, 1.5 mmol Indium content) is added to the reactor. The hexane is removed under reduced pressure. When all hexane is removed, 67.1 mmol of phenylbutyl amine is added to the reactor. Diethylzinc, and hexamethyldisilathiane are used as the Zn, and S precursors, respectively. 14.91 mmol of diethylzinc and 14.91 mmol of hexamethyldisilathiane are each dissolved in 42 ml of squalane inside a nitrogen atmosphere glove box. Once the precursor solutions are prepared, the reactor is heated to 250° C. under nitrogen. The Zn and S solutions are added dropwise at an even rate to the reactor solution over the course of 2 hours at 250° C. using a syringe pump. Thirty minutes after the start of the Zn/S addition, the BPA/o-terphenyl (solution kept at 130° C.) injection, and continued every 30 minute for total of 3 injection at 33 ml each injection. After the shell growth, the nanocrystals are transferred to a nitrogen atmosphere glovebox and precipitated out of the growth solution by adding isopropanol. The resulting precipitates are then dispersed in toluene and precipitated out of solution for a second time by adding a 1:1:1 mixture of butanol, isopropanol and hexane.

An example of a sample of isolated cores-shell nanocrystals dispersed in toluene or fluorobenzene (FB) prepared substantially in accordance with the procedure described in Example 3B demonstrated the following characteristics:

Abs/Emission/FWHM (nm)/$QY(\%)$=597/630/56 nm/74.5% in Toluene

Abs/Emission/FWHM (nm)/$QY(\%)$=597/629/56 nm/70.7% in Fluorobenzene

Example 4

Preparation of Semiconductor Nanocrystals with Benzylphosphonic Acid Capable of Emitting 626 nm Light A. Synthesis of InP Cores:

50.8 mmol myristic acid is added to 200 ml of squalane in a 0.5 L glass reactor. The reaction mixture is dried and degassed at 100° C. for one hour. The reaction mixture is then allowed to cool to 70° C. 5.37 mmol of 2,2'-biphenol is added and the mixture is degassed again for 30 minutes. The reactor is backfilled with nitrogen and the temperature is set to 195° C. 16.89 mmol of trimethylindium, 5.17 mmol of dioctylamine, 8.44 mmol of tris(trimethylsilyl)phosphine, 117 mmol diphenyl and 294 mmol diphenylether are combined into a single In/P solution. The In/P solution is split evenly into two 55 ml syringe barrels. When the reactor temperature reaches 195° C., the In/P solution is then rapidly injected from the 2 syringes into the reactor. The temperature controller is immediately set to a 170° C. growth temperature. The reaction mixture is heated at 170° C. for 5 minutes at which point the heating mantle is removed from the reaction flask and the mixture is allowed to cool to room temperature. The InP cores are precipitated out of the growth solution inside a nitrogen atmosphere glovebox by adding 600 ml isopropanol.

An example of a sample of isolated cores dispersed in hexane prepared substantially in accordance with the procedure described in Example 4A demonstrated the following characteristics: (Abs/Emission/FWHM (nm)=536/572/53)

B. Synthesis of InP/ZnS Core-Shell Nanocrystals:

695 mmol of 1,2-diphenylbenzene and 40 ml of Squalane are loaded into a 0.5 L glass reactor. The mixture is then dried and degassed in the reactor by heating to 75° C. for about an hour. 24.52 mmol of benzylphosphonic acid (BPA) is added to 40 ml of 1-dodecyl-2-pyrrolidinone (NDP) in a 250 ml flask and degassed at 40° C. for 1 hour. A hexane solution containing isolated InP cores prepared substantially in accordance with the procedure described in Example 4A above (1.98 mmol Indium content) is added to the reactor. The hexane is removed under reduced pressure. When all hexane is removed, 63.3 mmol of phenylbutyl amine is added to the reactor. Diethylzinc, and hexamethyldisilathiane are used as the Zn, and S precursors, respectively. 15.76 mmol of diethylzinc and 15.76 mmol of hexamethyldisilathiane are each dissolved in 40 ml of squalane inside a nitrogen atmosphere glove box. Once the precursor solutions are prepared, the reactor is heated to 250° C. under nitrogen. The full amounts of the Zn and S solutions are added dropwise at an even rate to the reactor solution over the course of 2 hours at 250° C. using a syringe pump. Thirty minutes after the start of the Zn/S addition, the BPA/NDP addition is begun. The full amount of the BPA/NDP solution is added by a syringe pump to the reactor at an even rate over a one hour period. After the shell growth, the nanocrystals are transferred to a nitrogen atmosphere glovebox and precipitated out of the growth solution by adding isopropanol. The resulting precipitate is then dispersed in toluene and precipitated out of solution for a second time by adding a 1:1:1 mixture of butanol, isopropanol and hexane.

An example of a sample of isolated cores-shell nanocrystals dispersed in toluene prepared substantially in accordance with the procedure described in Example 4B demonstrated the following characteristics: (Abs/Emission/FWHM (nm)=588/626/57) and a solution QY of approx 70%.

Example 5

Preparation of Semiconductor Nanocrystals

A. The Synthesis of InP Cores:

Myristic acid (1.151 g, 5.04 mmol) and 2,2'-biphenol (100 mg, 0.537 mmol) are weighed out into a 50 mL three neck flask equipped with a stir bar, thermocouple temperature probe, condenser connected with an $N_2$-vacuum inlet/outlet. Each of the remaining necks is sealed with a rubber septum. Dry squalane (10 mL) is added to the reaction vessel, which is heated to 100~° C., degassed for 1 hour at this temperature, and backfilled with nitrogen. Biphenyl (2.12 g) and diphenyl ether (5.88 g) are combined in a 20 mL septum capped vial and heated to form a homogeneous mixture. The resulting solution is transferred into a Shlenck tube and degassed for 5 minutes and backfilled with nitrogen three times. The tube is then sealed and brought into a drybox. Six milliliters of the solution is transferred into a 20 mL septum vial, to which is further added trimethyl indium (270 mg, 1.69 mmol), di-n-octylamine (489 mg, 2.02 mmol), tris (trimethylsilyl)phosphine (211.5 mg, 0.844 mmol). The mixture is thoroughly mixed until a homogeneous solution formed. The content of the vial is then loaded to a 10 mL syringe, moved out of the drybox in a Ziploc bag. The temperature of flask containing the 2,2'-biphenol and myristic acid solution is increased to 200~C, and the target temperature on the temperature controller is set to 170° C. When the temperature of the solution drops to 190° C., the content of syringe (consisting of trimethyl indium, di-n-octylamine, and tris(trimethylsilyl)phosphine) is rapidly injected via a syringe. After 8 minutes the emission maximum can reach about 609 nm and heat is removed.

The content of the flask is allowed to cool to 80° C., and is transferred into a vial pre-filled with nitrogen and brought to the drybox. The InP core is precipitated by adding 3 folds of 10% methanol in butanol. The mixture is centrifuged at 4000 rpm for 5 minutes and the liquid layer is discarded. The precipitate is dispersed in hexane (~8 mL), and filtered through a 0.2 µm Teflon filter to form an indium phosphide quantum dot core dispersion.

An example of a sample of cores dispersed in hexane prepared substantially in accordance with the procedure described in Example 5A demonstrated the, following characteristics: λmax=609 nm and a FWHM of about 47 nm.

B. Shell Growth onto InP Cores Using n-Octadecylphosphonic (ODPA) as a Ligand

Ten grams of tri-n-octylphosphine oxide (TOPO) is weighed out into a 50 mL 4-necked flask with a football-shaped magnetic stir bar and a rubber septum on two of the four necks, a distillation column on the middle neck and a temperature probe in the last neck. The flask and its contents are heated to 130° C. while under nitrogen. When the flask is stable at 130° C., its content is placed under vacuum at this temperature for 2 hours. The flask is then back-filled with nitrogen and cooled to 75° C. 10.0 mL of InP cores (prepared substantially as described in Example 5A) dispersed in hexane (first absorption peak is at 579 nm, Optical Density (OD) at 350 nm is 0.28) is added under nitrogen flow and hexane is removed under vacuum. Into a separated 50 mL three-necked flask 0.8 grams of n-octadecylphosphonic acid (ODPA, obtained form PCI SYNTHESIS, Newburyport, Mass.,) and 5 g of TOPO are added. The ODPA and TOPO mixture are heated to 100° C. under vacuum for 2 hours, and then placed under nitrogen. In a drybox, the following solutions are prepared and loaded into two 5 mL: syringes#1 (4 mL of tri-n-octylphosphine and 98.02 mg diethylzinc) and syringe #2 (4 mL of Tri-n-octylphosphine, and 141.64 mg of 1,1,1,3,3,3-hexamethyldisilathiane). The syringes are then moved out of the drybox. Micro capillary tubing is then quickly loaded onto each syringe and a small amount of solution is pushed out to clear the tubing of nitrogen. When all of the hexane in the flask containing the indium phosphide core is pulled off, its contents are put under nitrogen. n-Decylamine (0.5 mL, obtained from glove box) is added, and the temperature of the reaction is set to 200° C. When the temperature reaches 150° C., both syringes are loaded into the syringe pumps and their contents is introduced to the reaction flask via two capillary tubes (one going through each of the free septa), at a rate of 2 mL/hour. During the addition, the ODPA solution in TOPO is added in 1 mL portions every 30 mm using a preheated syringe. When all overcoating solution had been added to the flask, the syringe pump lines are removed from the flask. The reaction is stirred at 200° C. for 5 minutes, and then the temperature is set to 150° C. and the reaction is heated under nitrogen at this temperature overnight (c.a. 15 h). A small sample of the reaction mixture is drawn out with a syringe and dispersed in hexane (in air). The solution is filtered through a 0.2 µm Teflon filter into a 1 cm cuvette.

The reaction mixture is transferred into a 40 mL septum vial, and brought into a drybox. The solution is divided into two 50 mL centrifuge tubes (~10 mL each) and 30 ml of a 3:1 MeOH/isopropanol mixture is added. The contents are thoroughly mixed (using vortexer) and the tubes are placed into the centrifuge and spun for 5 minutes at 4000 rpm. The fluids are discarded and the residue is thoroughly dispersed in hexane (10 mL), and centrifuged again at 4000 rpm for 5 minutes. The hexane solution is transferred to a clean 50 mL centrifuge tube, and 30 ml of a 3:1 MeOH/isopropanol mixture is added. The contents are thoroughly mixed (using vortexer) and centrifuged for 5 minutes at 4000 rpm. The fluids are discarded and the residue is thoroughly dispersed in hexane (~10 mL). The hexane solution is filtered through 0.2 µm Teflon filter. 40 µL of the solution is diluted to 2.5 mL using dry hexane and absorption, emission spectra are recorded.

An example of a sample of isolated cores-shell nanoctystals prepared substantially in accordance with the procedure described in Example 5B demonstrated the following characteristics: emission quantum yield of the purified core/shell material of 34% using a fluorometer based on Rhodamine 101 standard, an emission maximum at 629 nm, a FWHM was 46 nm, and an OD of the sample at 530 of 0.0725.

Example 6

Preparation of Semiconductor Nanocrystals with n-Hexylphosphonic Acid Capable of Emitting 614 nm Light A. Synthesis of InP Cores:

82.32 mmol myristic acid, 8.06 mmol 2,2'-biphenol, and 300 mL of squalane are added in a 0.5 L glass reactor. The reaction mixture is dried and degassed at room temperature for one hour. The reactor is backfilled with nitrogen and the temperature is set to 195° C. 25.34 mmol of trimethylindium, 12.57 mmol of tris(trimethylsilyl)phosphine, and 30.36 mmol of dioctylamine are dissolved in 45 mL of a 2:5 molar mixture of diphenyl and diphenylether for a single In/P solution. The InP solution is split evenly into two 55 mL syringe barrels. When the reactor temperature reaches 195° C., the In/P solution is then rapidly injected from the 2 syringes into the reactor. The temperature is immediately dropped to 183° C. The reaction mixture is heated for 3 min and 35 sec at the 195° C. set temperature of temperature controller, and then the heating mantle is removed and quickly quenched by cold squalane prepared by mixing liquid nitrogen with squalane. The mixture is allowed to cool to room temperature. The InP cores are precipitated out of the growth solution inside a nitrogen atmosphere glovebox by adding 900 ml isopropanol and collected by spinning in centrifuge.

An example of a sample of isolated cores dispersed in hexane prepared substantially in accordance with the procedure described in Example 6A demonstrated the following characteristics: (Abs/Emission/FWHM (nm)=567/604/55)

B. Synthesis of InP/ZnS Core-Shell Nanocrystals:

160 grams of 1,2-diphenylbenzene and 40 mL of squalane are loaded into a 500 mL glass reactor. The reactor and its contents are heated to 75° C. during degassing for an hour, and it is back-filled with nitrogen. 150 mL of InP nanocrystals (prepared substantially in accordance with the core preparation described in Example 6A) is added under nitrogen flow and hexane is removed under vacuum. Meanwhile, 5.56 grams of n-hexylphosphonic acid (HPA, obtained from PCI SYNTHESIS, Newburyport, Mass.) and 80 mL of 1-dodecyl-2-pyrrolidinone (NDP) are mixed into a round bottom flask with gently heating to dissolve HPA. The solution is pumped under vacuum for an hour at 40° C., and it is loaded in a syringe. Diethylzinc, and hexamethyldisilathiane are used as the Zn, and S precursors, respectively. Each of 9.61 mmol of diethylzinc and 9.61 mmol of hexamethyldisilathiane is dissolved in 80 mL of squalane inside a nitrogen atmosphere glove box, and it is loaded in a separate syringe. Once all hexane is removed from the reactor, it is back-filled with nitrogen. Once the reactor, HPA/NDP solution, and precursor solution are ready, 8 mL of phenylbutyl amine is added to the reactor and the reactor is heated to 250° C. The full amounts of the Zn and S solutions are added dropwise at an even rate to the reactor solution over the course of 2 hours at 250° C. using a syringe pump. Thirty minutes after the start of the Zn/S addition, the HPA/NDP addition is begun. The full amount of the HPA/NDP solution is added by a syringe pump to the reactor at an even rate to the reactor over a one hour period. After the shell growth, the nanocrystals are transferred to a nitrogen atmosphere glovebox and precipitated out of the growth solution by adding a 1:3 mixture of isopropanol and methanol. The resulting precipitates are then dispersed in toluene and precipitated out of solution for a second time by adding a 1:3 mixture of isopropanol and methanol.

An example of a sample of isolated core-shell nanocrystals dispersed in toluene prepared substantially in accordance with the procedure described in Example 6B demonstrated the following characteristics: (Abs/Emission/FWHM (nm)/QY=576/614/54/73%)

Quantum Yield Measurements

The solution quantum yield (QY) of isolated cores-shell nanocrystals can be measured based on representative QY standards. (*J. Luminescence.*, 1983, 27, 455.; *J. Phys. Chem.*, 1979, 83, 696.; *J. Phys. Chem.*, 1980, 84, 1871.) Rhodamine 560 (also known as Rhodamine 110), and Rhodamine 110 are used for green and red QY standards, respectively. The optical density of a QY solution sample can be fixed, e.g., to be in a range of 0.07-0.1 at the excitation wavelength, for QY measurement.

Additional information that may be useful with the present invention is included in International Application No. PCT/US2007/13152 of Coe-Sullivan, et al., for "Light-Emitting Devices and Displays With Improved Performance", filed 4 Jun. 2007; International Application No. PCT/US2008/007901 of Linton, et al., for "Compositions And Methods Including Depositing Nanomaterial", filed 25 Jun. 2008; International Application No. PCT/US2008/01065 of Breen, et al., for "Functionalized Semiconductor Nanoparticles And Method", filed 12 Sep. 2008; International Application No. PCT/US2007/024750 of Coe-Sullivan, et al. for "Improved Composites And Devices Including Nanoparticles", filed 3 Dec. 2007; International Application No. PCT/US2009/004345, of Breen, et al for "Nanoparticle Including Multi-Functional Ligand And Method", filed 28 Jul. 2009, International Application No. PCT/US2007/024320, of Clough, et al., for "Nanocrystals Including A Group III A Element And A Group V A Element, Method, Composition, Device And Other Products", filed 21 Nov. 2007, and U.S. Ser. No. 12/283,609 of Coe-Sullivan, et al. for "Compositions, Optical Component, System Including An Optical Component, Devices, And Other Products", filed 12 Sep. 2008. The disclosures of each of the foregoing applications are hereby incorporated herein by reference in their entireties.

As used herein, the singular forms "a", "an" and "the" include plural unless the context clearly dictates otherwise. Thus, for example, reference to an emissive material includes reference to one or more of such materials.

The entire contents of all patent publications and other publications cited in this disclosure are hereby incorporated herein by reference in their entirety. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

The invention claimed is:

1. A method for preparing semiconductor nanocrystals, the method comprising:
   providing a mixture including one or more acids, one or more phenol compounds, and a solvent,
   adding a precursor mixture including one or more cation precursors, one or more anion precursors, and a second solvent to the mixture including one or more acids, one or more phenol compounds, and a solvent to form a reaction mixture, wherein at least one cation precursor comprises a Group III cation precursor and at least one anion precursor comprises a Group V anion precursor, and
   reacting at least a portion of the one or more cation precursors and one or more anion precursors in the reaction mixture at a temperature and for a period of time sufficient to produce semiconductor nanocrystals having a predetermined composition.

2. A method in accordance with claim 1 wherein the mixture including one or more acids, one or more phenol compounds, and a solvent is heated prior to adding any precursor mixture.

3. A method in accordance with claim 1 wherein the mixture including one or more acids, one or more phenol compounds, and a solvent is heated prior to adding any precursor mixture to a temperature sufficient for initiating reaction of the precursors.

4. A method in accordance with claim 2 further comprising heating or maintaining the reaction mixture at a second temperature sufficient to produce the semiconductor nanocrystals having a predetermined composition.

5. A method for preparing semiconductor nanocrystals, the method comprising:
   providing a mixture including one or more acids, one or more phenol compounds, and a solvent,
   adding a precursor mixture including one or more cation precursors, one or more anion precursors, and a second solvent to the mixture including one or more acids, one or more phenol compounds, and a solvent-to form a reaction mixture, wherein at least one cation precursor comprises a Group III cation precursor and at least one anion precursor comprises a Group V anion precursor, and
   heating the reaction mixture at a temperature and for a period of time sufficient to produce semiconductor nanocrystals having a predetermined composition.

6. A method in accordance with claim 1 wherein one or more phenol compounds comprise a monocyclic phenol or a polycyclic phenol.

7. A method in accordance with claim 1 wherein the second solvent comprises a weakly coordinating solvent.

8. A method in accordance with claim 1 wherein the second solvent comprises a non-coordinating solvent.

9. A method in accordance with claim 1 wherein the one or more acids comprise a carboxylic acid compound.

10. A method in accordance with claim 1 wherein the precursor mixture further comprises one or more amine compounds.

11. A method in accordance with claim 10 wherein the molar ratio of [the one or more phenol compounds plus the one or more acids plus the one or more amine compounds] to the one or more cations included in the reaction mixture is greater than about 4.5.

12. A method in accordance with claim 10 wherein the molar ratio of [the one or more phenol compounds plus the one or more acids plus the one or more amine compounds] to the one or more cations included in the reaction mixture is in a range from about 4.5 to about 5.

13. A method in accordance with claim 10 wherein the molar ratio of [the one or more phenol compounds plus the one or more acids plus the one or more amine compounds] to the one or more cations included in the reaction mixture is in a range from about 4.5 to about 6.

14. A method in accordance with claim 9 wherein the at least one of the one or more carboxylic acid compounds comprises $CH_3(CH_2)_nC(O)OH$ wherein n=1-18.

15. A method in accordance with claim 9 wherein at least one of the one or more carboxylic acid compounds further comprises one or more aromatic groups.

16. A method in accordance with claim 1 wherein at least one of the one or more phenol compounds comprises a mixture of two or more different phenol compounds.

17. A method in accordance with claim 1 wherein the reaction mixture further includes one or more ligands in addition to the acids and phenols in the reaction mixture.

18. A method in accordance with claim 3 wherein the reaction mixture temperature is in a range from about 180° C. to about 270° C.

19. A method in accordance with claim 3 wherein the reaction mixture temperature is approximately 200° C.

20. A method in accordance with claim 1 wherein the reaction mixture includes more than one acid and each of the acids comprises a carboxylic acid compound.

21. A method for preparing semiconductor nanocrystals comprising a Group III element and a Group V element, the method comprising:
combining one or more Group III cation precursors, one or more Group V anion precursors, one or more ligands, one or more amine compounds, and a first solvent to form a first mixture;
adding the first mixture to a second mixture, the second mixture comprising one or more carboxylic acid compounds, one or more phenol compounds, and a second solvent, wherein at the time of addition, the second mixture is at a temperature sufficient to initiate reaction of one or more Group III cation precursors with one or more of the Group V anion precursors.

22. A method in accordance with claim 3 further comprising adjusting the temperature after reaction of precursors is initiated to a second temperature sufficient to grow nanocrystals.

23. A method in accordance with claim 1 further comprising isolating the nanocrystals.

24. A population of semiconductor nanocrystals comprising a semiconductor nanocrystal prepared in accordance with claim 1 comprising a core comprising a first semiconductor material comprising at least one Group III element and at least one Group V element and a shell disposed over at least a portion of an outer surface of the core, wherein the shell comprises a second semiconductor material that is different from the first semiconductor material, and ligands are attached to an outer surface of the shell, wherein the ligands comprise a phosphonic acid compound and an amine compound, wherein the solution quantum yield of the population is at least 70%.

25. A population in accordance with claim 24 wherein the ligands comprise decyl amine and octadecyl phosphonic acid.

26. A population in accordance with claim 24 wherein the ligands comprise phenylbutyl amine and benzylphosphonic acid.

27. A method in accordance with claim 21 further comprising adjusting the temperature after reaction of precursors is initiated to a second temperature sufficient to grow nanocrystals.

28. A method in accordance with claim 1 wherein a phenol compound comprises a polycyclic phenol.

29. A method in accordance with claim 1 wherein a phenol compound comprises resorcinol, hydroquinone, 2,2'-biphenol, bisphenol F, bisphenol A, 2,2'-dihydroxybenzophenone, 2,4-di-tert-butylphenol, 2-phenylphenol, or 2,6-diphenylphenol.

30. A method in accordance with claim 1 further comprising precipitating the produced semiconductor nanocrystals.

* * * * *